United States Patent
Onogi et al.

(10) Patent No.: US 7,298,594 B2
(45) Date of Patent: Nov. 20, 2007

(54) ELECTRIC-FIELD-EFFECT MAGNETORESISTIVE DEVICES AND ELECTRONIC DEVICES USING THE MAGNETORESISTIVE DEVICES

(75) Inventors: Toshiyuki Onogi, Higashimatsuyama (JP); Masahiko Ichimura, Sendai (JP); Tomihiro Hashizume, Hatoyama (JP)

(73) Assignee: Hitachi, Ltd., Tokyo (JP)

( * ) Notice: Subject to any disclaimer, the term of this patent is extended or adjusted under 35 U.S.C. 154(b) by 644 days.

(21) Appl. No.: 10/862,323

(22) Filed: Jun. 8, 2004

(65) Prior Publication Data

US 2004/0257894 A1 Dec. 23, 2004

(30) Foreign Application Priority Data

Jun. 20, 2003 (JP) ............................. 2003-176293

(51) Int. Cl.
*G11B 5/127* (2006.01)
(52) U.S. Cl. .................................... 360/313
(58) Field of Classification Search ................ 360/313; 365/202, 145, 171, 243.5
See application file for complete search history.

(56) References Cited

U.S. PATENT DOCUMENTS 5,652,445 A * 7/1997 Johnson ...................... 257/295
5,654,566 A * 8/1997 Johnson ...................... 257/295

OTHER PUBLICATIONS

Moodera, Jagadeesh S. and Lisa R. Kinder, "Ferromagnetic-insulator-ferromagnetic tunneling: Spin-dependent tunneling and large magnetoresistance in trilayer junctions (invited)", J. Appl. Phys. vol. 79, No. 8, Apr. 15, 1996, pp. 4724-4729.
Grollier, J., et al., "Spin-polarized current induced switching in Co/Cu/Co pillars", Applied Physics Letters, vol. 78, No. 23, Jun. 4, 2001, pp. 3663-3665.
Ohno, H. "Electric-field control of ferromagnetism", Nature, vol. 408, Dec. 2000, pp. 944-946.

* cited by examiner

*Primary Examiner*—Allen Cao
(74) *Attorney, Agent, or Firm*—Reed Smith LLP; Stanley P. Fisher, Esq.; Juan Carlos A. Marquez, Esq.

(57) ABSTRACT

Magnetoresistive devices with increased response sensitivity to external magnetic fields and an increased magnetoresistive ratio (MR ratio) to cope with rapid advances made in a highdensity magnetic recording device. A patterned dielectric layer is laminated in a flat shape on a substrate capable of being doped with carriers (holes) in an electric field, and an FET structure with gate electrodes is then fabricated on that dielectric layer, and the substrate spatially modulated by applying a nonuniform electrical field to induce a first ferromagnetic domain, a nonmiagnetic domain and a second ferromagnetic domain.

7 Claims, 9 Drawing Sheets

ELECTRIC-FIELD-EFFECT MAGNETORESISTIVE DEVICES AND ELECTRONIC DEVICES USING THE MAGNETORESISTIVE DEVICES

CLAIM OF PRIORITY

The present application claims priority from a Japanese application JP 2003-176293 filed on Jun. 20, 2003, the content of which is hereby incorporated by reference into this application.

FIELD OF THE INVENTION

The present invention relates to laminated magnetoresistance devices containing a ferromagnetic layer, nonmagnetic layer, ferromagnetic layer and to electronic devices using these magnetoresistance devices.

BACKGROUND OF THE INVENTION

The magnetoresistance effect is generally a physical phenomenon wherein a magnetic field is applied to a magnetic material to vary the electrical resistance. The GMR device that utilizes the giant magnetoresistance (GMR) effect discovered in metallic multilayer film structures comprised of laminations of ferromagnetic metal layers/nonmagnetic metal layers/ferromagnetic metal layers is already utilized in magnetic read-out heads. In recent years, the application of magnetic random access memory (MRAM) devices as non-volatile memories is under study. However, due to the tremendous advances made in magnetic recording density, utilizing magnetoresistance devices in next generation magnetic heads and large capacity MRAM requires making the magnetoresistance ratio (MR ratio) even larger, and making further increases in the sensitivity response to external magnetic fields.

In recent years, magnetoresistance devices (tunneling magneto-resistance devices: TMR devices) that utilize the tunnel current flowing between both ferromagnetic layers have been discovered. In other words, these TMR devices use the tunnel current that flows when a tunnel junction with an insulating layer is inserted between two ferromagnetic layers namely, a ferromagnetic tunnel junction. The magnetoresistance ratio in these ferromagnetic tunnel junction devices exceeds 20 percent (Non-patent Document 1) so there is increasing potential for applications in magnetic heads and magnetoresistance effect memories. The magnetoresistance ratio at room temperature is approximately 40 percent; however an even larger magnetoresistance ratio is needed in order to obtain the output voltage needed for magnetic read-out heads of high density magnetic recording medium.

In MRAM applications using TMR devices, an external magnetic field (an electromagnetic field) is applied to ferromagnetic layer without a fixed magnetic direction (freely magnetized layer) by making an electrical current flow in the external wiring to reverse the magnetic direction of the free layer of magnetization. However, the constantly shrinking size of the memory cell brings about an increase in the magnetic field (magnetic switching field) required for magnetic reversal of the freely magnetized layer that causes an unavoidable increase in the wiring current for writing. Therefore, increasing the capacity of the MRAM causes an unavoidable increase in electrical power consumption. The increased electrical current in the wiring brings the potential problem of the wiring melting. One method for resolving this problem is to cause a magnetic reversal by injecting a spin-polarized spin current (Non-patent Document 2). However, this method for inducing a magnetic reversal by injecting a spin current, increases the electrical current density flowing in the TMR device. This increase in electrical current density might possibly cause the wiring to deteriorate or induce a ferroelectric breakdown in the tunnel insulation (dielectric) due to electro-migration.

In recent years, on the other hand, much attention has been focused on new magnetic material capable of being utilized in magnetoresistive devices. These are diluted magnetic semiconductors such as type III-IV semiconductors typically of GaAs, InAs or type IV semiconductors of germanium, substituted in part with the magnetic atom manganese. In particular, structures of field effect transistors (FET) fabricated using a magnetic semiconductor as the substrate are capable of inducing a magnetic phase transition from a non-magnetic phase to a ferromagnetic phase by applying an external voltage from the gate electrode to the internal portion of the magnetic semiconductor substrate (Non-patent Document 3).

This electric field-induced magnetic phase transition is caused by the fact that the ferromagnetic transition temperature of the magnetic semiconductor is strongly dependent on the carrier (hole) concentration. The above FET device is an innovative device that utilizes this physical effect to cause shifts in the bulk magnetic state (ferromagnetic state/non-magnetic state) even under fixed temperature conditions, by effectively injecting (doping) carriers the semiconductor internally by applying an electrical field externally. Besides diluted magnetic semiconductors, another material known to be capable of this type of electric field-induced magnetic phase transition is manganese oxides having a perovskite crystalline structure. However, the internal magnetic semiconductor substrate of this FET is not comprised of a ferromagnetic/nonmagnetic/ferromagnetic junction structure, and so no improvement in the MR ratio can be expected even in the vicinity of the magnetic phase transition. This FET structure is therefore not suited for use as a magnetoresistive device.

The diluted magnetic semiconductors are predicted to be a half metal (spin polarization of the fermi surface equals 100%) by an elaborate calculation of electronic states. Based on this prediction, the laminated magnetoresistive device with a nonmagnetic semiconductor layer inserted between the magnetic semiconductor layers is expected to have an MR ratio in excess of 100%. Even though, trial fabrication of ferromagnetic junction type magnetoresistive devices using magnetic semiconductor has also begun very recently, a magnetoresistive device having an MR ratio in excess of 40 percent at room temperature has not been achieved.

[Non-patent Document 1]
J. Appl. Phys. 79, 4724 (1996)
[Non-patent Document 2]
Appl. Phys. Lett. 78, 3663 (2001)
[Non-patent Document 3]
Nature 408, 944 (2000), Science 295, 651 (2002)

The magnetoresistive device of the related art typically contains a three-layer laminated heterogeneous junction structure comprised of a ferromagnetic layer, nonmagnetic layer, and ferromagnetic layer. However fabricating a satisfactory heterogeneous interface/junction and a uniformly thin intermediate layer is extremely difficult. Microscopic irregularities at the crystal boundaries of the heterogeneous junction and the effects of microscopic pin holes formed unintentionally in the nonmagnetic intermediate layer create the problem that the MR ratio of the magnetoresistance device drastically deteriorates from the theoretically expected value. Further, the MR ratio in the magnetoresistive device, varies according to the film thickness of the nonmagnetic intermediate layer so that obtaining a large improvement in the MR ratio and optimizing with the peripheral circuits could only be achieved by experimentally fabricating large numbers of devices with nonmagnetic layers of different film thickness.

SUMMARY OF THE INVENTION

In order to resolve the above problems with the related art, a first object of the present invention is to provide an optimized, electrically-controlled magnetoresistance device, further having an improved MR ratio only by using the field effect in FET structures using magnetic materials (for example, diluted magnetic semiconductor) capable of electric-field type of carrier-doping of the substrate, and further provide magnetic sensors of different types or high sensitivity magnetic heads for high density magnetic recording medium utilizing these magnetoresistive devices. A second object of the present invention is to provide an MRAM device having low power consumption and an adequate output signal by utilizing a field effect magnetoresistive device as the means for writing the MRAM memory cells.

The magnetoresistance device utilizing the field effect of the present invention is a device containing a substrate capable of being doped with carriers (holes) in an electric field, wherein a patterned dielectric (insulating) layer is laminated in a flat shape on this substrate and by forming an FET structure with gate electrodes on that dielectric layer, a non-uniform spatially modulated electrical field is applied to the substrate. This field effect is essentially characterized by inducing a strongly electric-doped domain (first ferromagnetic domain), a weakly doped domain (nonmagnetic domain), and a strongly doped electrical field domain (second ferromagnetic domain).

The present invention further provides a magnetoresistive device with an MR ratio equal to or higher than the three-layer laminated heterogeneous junction device of the related art and is characterized by containing a means to control the magnetoresistive value or MR ratio accompanying the electrical current flowing between the first and the second ferromagnetic domains magnetically coupled via a nonmagnetic domain, by applying an external voltage to the gate electrodes.

The field effect spin-controlled device of the present invention is characterized essentially in actively controlling the direction of magnetization of the first through the second ferromagnetic domains in magnetoresistive devices with the above described structure by utilizing the electric field effect. Here, the magnetic exchange interaction between both ferromagnetic domains inducing positive and negative oscillations as a function of the particular voltage, is utilized based on the RKKY (Ruderman-Kittel-Kasuya-Yosida) mechanism or quantum well mechanism functioning via the intermediate nonmagnetic domain in both the ferromagnetic domains. The present invention therefore provides a technology for magnetic reversals by electric field carrier doping.

The above described device utilizes the same material in the substrate and therefore has the advantages of no crystal irregularities or defects in the magnetic junction boundary effective in inducing the field effect. In the device structure of the present invention, the MR ratio can be controlled and optimized just by applying a voltage from the gate electrode. Another advantage is that the power consumption required for device operation can be significantly lowered by utilizing the electrical field effect. Further, utilizing a magnetic semiconductor in the substrate will provide good compatibility with conventional semiconductor manufacturing process technology and make integration with peripheral semiconductor circuits simpler.

The magnetic read-out head and magnetic sensor of the present invention are characterized in containing a field effect magnetoresistive device. The magnetic random access memory of the present invention is characterized in containing a field effect spin-controlled device.

DETAILED DESCRIPTION OF THE PREFERRED EMBODIMENTS

First Embodiment

Figure 1A:
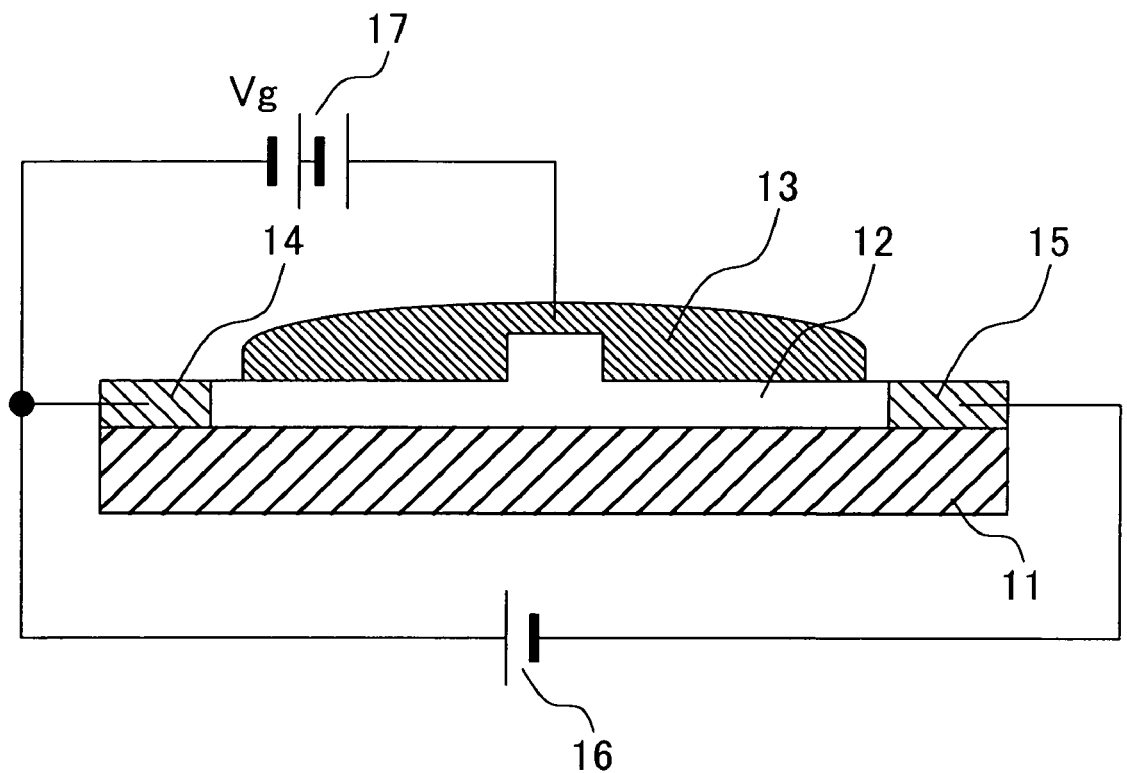
FIG. 1A is a cross sectional view showing the FET structure of the field effect magnetoresistive device of the first embodiment.

FIG. 1A is a cross sectional view showing the FET structure of the field effect magnetoresistance device of the first embodiment. An electrical insulating layer 12 whose structure is patterned in a convex shape is formed on the upper part of the nonmagnetic substrate 11 capable of being doped with electric field carriers. A first metallic electrode (gate electrode) 13 is formed on the insulating (film) layer 12. When an external section applies a positive voltage of Vg>0 to the gate electrode 13 from the power supply 17, a strong electrical field is applied locally to the substrate directly below the region where the insulating film layer is thin and that part of the substrate can be doped with a high concentration of hole carriers (doped region with high concentration of carriers is formed). On the other hand, when a weak electrical field is applied to the region on the substrate directly below region where the insulating film is thick, then that part of the substrate can be doped with a low concentration of hole carriers (doped region with a low concentration of carriers is formed).

Figure 1B:
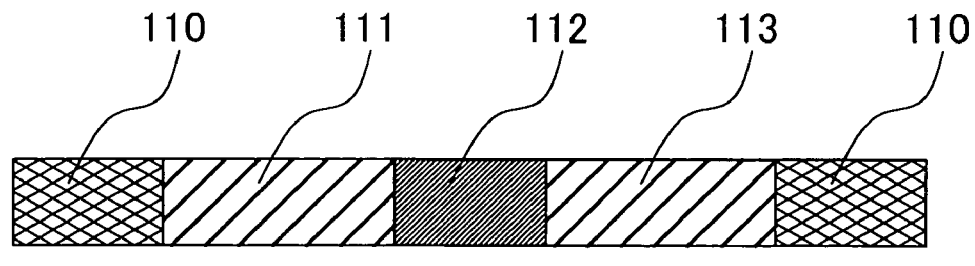
FIG. 1B is a cross sectional view of a typical junction structure for the ferromagnetic domain/nonmagnetic domain/ferromagnetic domain patterned in a flat shape.

FIG. 1B is a cross sectional view of a typical junction structure for the ferromagnetic domain/nonmagnetic domain/ferromagnetic domain patterned in a flat shape (on the substrate). Setting the voltage Vg as needed in this structure, allows a transition in the nonmagnetic substrate 11 to a highly concentrated doped region in ferromagnetic domain 111 and 113, and into the low concentrated doped region of nonmagnetic domain 112. The electrical field has no actual effect here on both ends 110 so this is a nonmagnetic domain which is the original nonmagnetic substrate 11.

When the intermediate nonmagnetic domain 112 within the junction structure comprised of the ferromagnetic domain 111/nonmagnetic domain 112/ferromagnetic domain 113 and patterned in a flat shape, conducts like a metal, then it effectively functions as a GMR (giant magnetoresistance) device. When the intermediate nonmagnetic domain 112 conducts like a dielectric or a semiconductor, then it effectively functions as a TMR (tunneling magnetoresistance) device. The electromagnetic resistance R(H) of the field effect magnetoresistance device of the present invention can by obtained by measuring the electrical resistance as a function of the external magnetic field H, when a power supply 16 is connected across a second metal electrode (source electrode) 14 and a third electrode (drain electrode) 15 formed on the upper part of both ends of substrate 11 and an electrical current made to flow.

An overview of the process for fabricating the three-terminal FET structure of the first embodiment is described next. The three-terminal FET structure of the first embodiment was fabricated by a process identical to that in semiconductor processing technology used for manufacturing MOS-FET devices.

A support substrate for forming the three-terminal FET structure is first of all prepared. This support substrate is for example a silicon substrate of a specified thickness. A magnetic semiconductor piece $Mn_xGe_{1-x}$ (X=0.04) capable of being doped with electric field carriers is used as the substrate 11. The substrate 11 is formed on this support substrate. An insulating alumina layer ($Al_2O_3$) is then deposited by sputtering or molecular beam epitaxy (MBE) to a uniform film thickness of 5 nanometers on the upper surface of the substrate 11 to form an electrical insulating film 12. The alumina layer here is formed by the natural oxidation method or plasma oxidization method after first forming an aluminum-atom layer by evaporation deposition. Further, a convex structure (convex portion width of 20 nm) is then formed by removing a film thickness of 3 nanometers from both sides of the insulating film 12 by a chemical etching method. Next a gate electrode (Au) 13, a source electrode (Au) 14 and a drain electrode (Au) 15 are evaporation deposited. An insulating layer is then formed as a protective layer and connections made to each electrode after forming the required wiring.

The substrate 11 may be comprised not just by the $Mn_xGe_{1-x}$, but by other materials capable of switching the magnetic—nonmagnetic states by typical carrier doping. Diluted magnetic semiconductor may for example be type III-V semiconductors such as GaAs, InAs atoms, or type IV semiconductors such as silicon or germanium with a portion of their atoms substituted by magnetic atoms such as manganese. Magnetic semiconductors doped with manganese atoms may be utilized in wide gap semiconductors such as GaN and ZnO. Besides magnetic semiconductors, perovskite crystal structures made up of manganese oxides or GaAs/MnSb granular structures may also be used. The insulating material need not only be alumina, and any material may be used as the insulating material if it has a high ferroelectric constant and does not cause destruction of the insulation when a gate voltage Vg is applied during device operation. Such insulating materials include $Si_3N_4$, SiO, and MgO.

The process described here may also be applied in the same way to the second embodiment and the third embodiment.

Second Embodiment

The FET structure of the field effect magnetoresistance device of the first embodiment can also be achieved with a ferromagnetic substrate capable of being electric carrier doped rather than by a non-magnetic substrate capable of being doped with electrical field carriers. In other words, a ferromagnetic domain/nonmagnetic domain/ferromagnetic domain junction structure possessing functions identical to the first embodiment can be achieved even by a ferromagnetic substrate capable of being doped with electric field carriers.

Figure 2A:
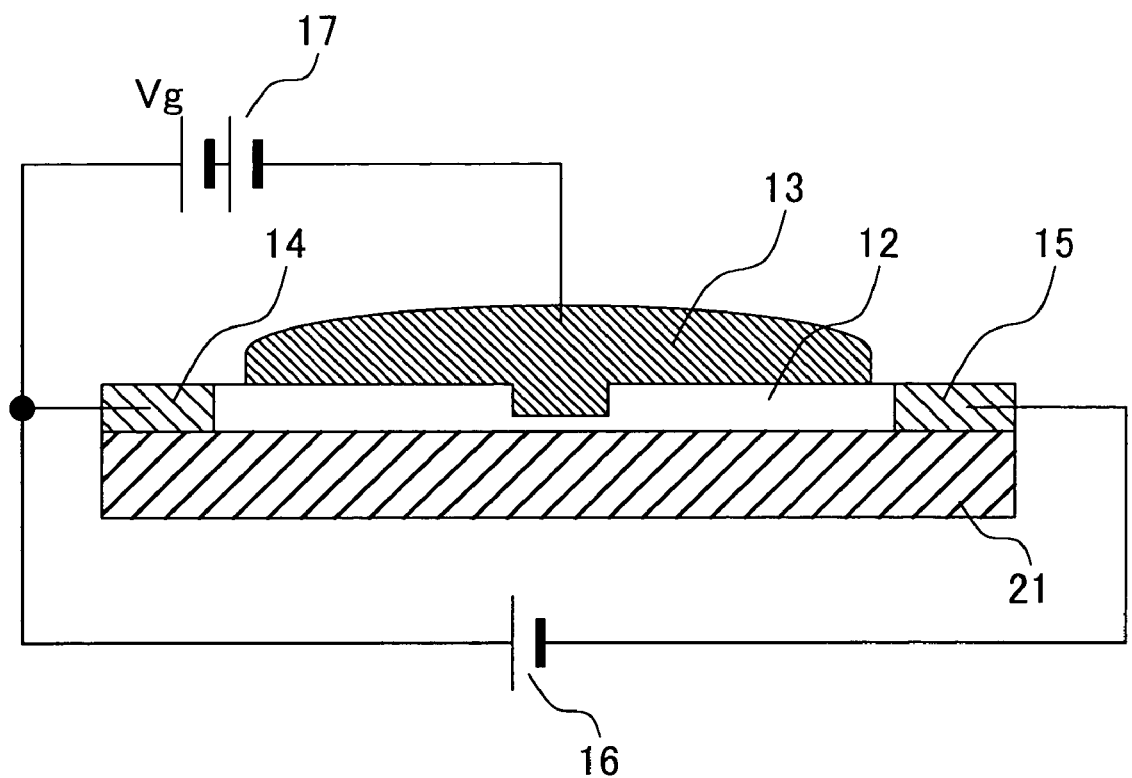
FIG. 2A is a cross sectional view showing the FET structure of the field effect magnetoresistive device of the second embodiment.

FIG. 2A is a cross sectional view showing the FET structure of the field effect magnetoresistance device of the second embodiment. Sections identical to the first embodiment of FIG. 1A are assigned the same reference numerals. Comparing FIG. 2A with FIG. 1A clearly shows that an electric field carrier dopable ferromagnetic substrate 21 is utilized instead of the electric field carrier dopable nonmagnetic substrate 11. This comparison also shows that a concave shape has been substituted for the convex shape of the electrical insulating film 12 pattern formed on the field carrier dopable ferromagnetic substrate 21. Further, a reverse bias voltage (negative voltage) Vg<0, has been applied to the gate electrode 13 instead of the positive voltage Vg>0.

Figure 2B:
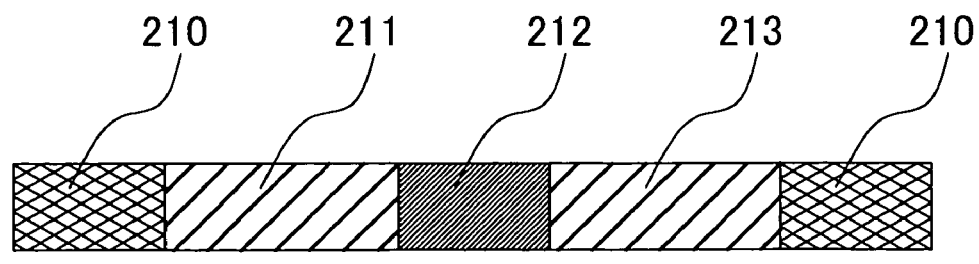
FIG. 2B is a cross sectional view of a typical junction structure for the ferromagnetic domain/nonmagnetic domain/ferromagnetic domain patterned in a flat shape.

FIG. 2B is a cross sectional view of a junction structure for the ferromagnetic domain/nonmagnetic domain/ferromagnetic domain patterned in a flat shape. Applying a suitable voltage value Vg in this junction structure shifts transitions just the intermediate region of the carrier doped ferromagnetic substrate 21 to a nonmagnetic domain 212 and transitions the ferromagnetic substrate 21 to the highly concentrated doped ferromagnetic domains 211 and 213. The electrical field has no actual effect here on both ends 210 so this is a ferromagnetic domain of the original ferromagnetic substrate 21.

Figure 3:
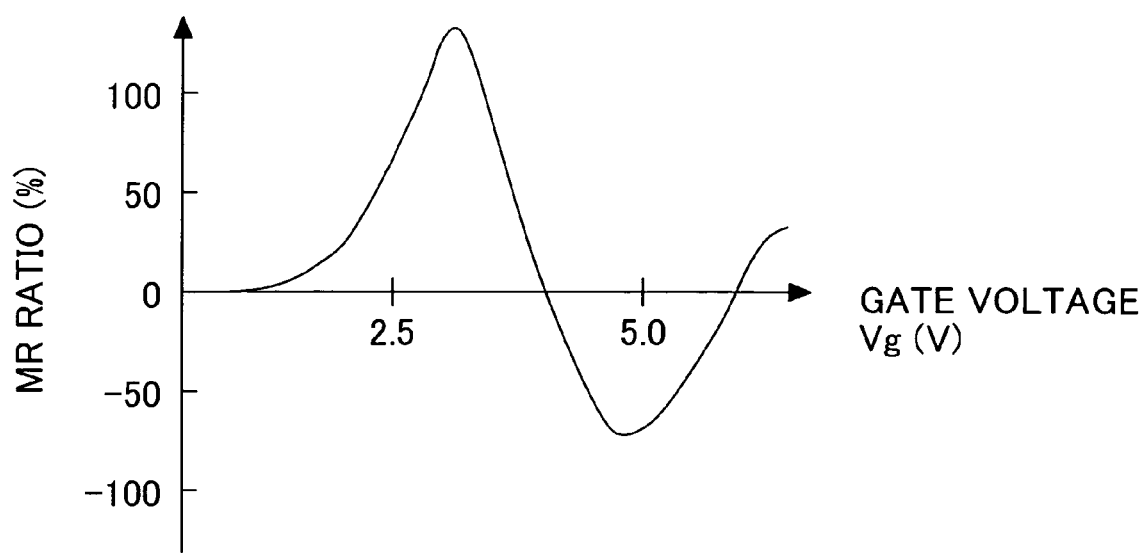
FIG. 3 is a graph showing the magnetoresistance (reluctance) characteristics of the magnetoresistance device of the first embodiment or second embodiment.

FIG. 3 is a graph showing the magnetoresistance (reluctance) characteristics of the magnetoresistance device fabricated as previously described. The MR ratio obtained from the electrical resistance by applying a gate voltage (Vg) of approximately three volts across the source electrode 14 and the drain electrode 15 was an extremely large value of approximately 120 percent.

Third Embodiment

Figure 4A:
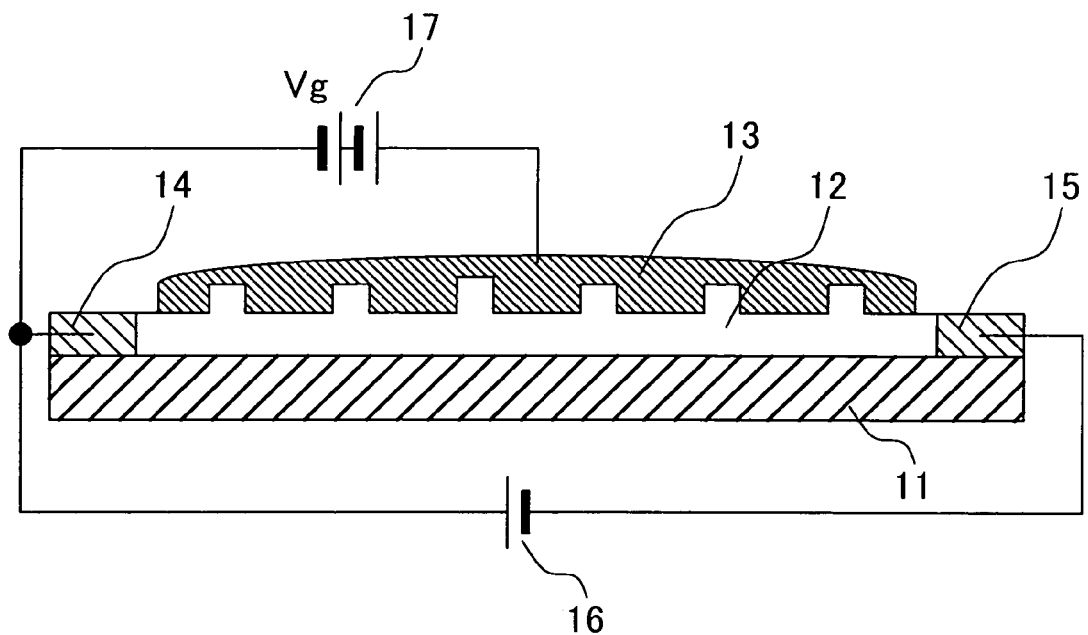
FIG. 4A is a cross sectional view showing the multi-joint structure of the FET structure of the first embodiment.
Figure 4B:
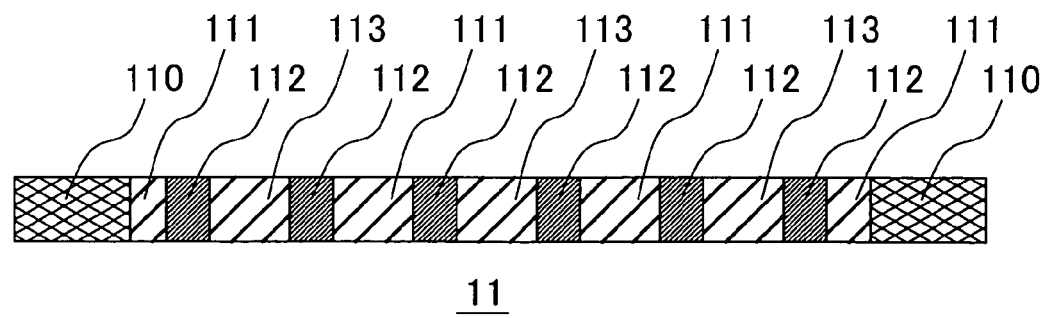
FIG. 4B is a cross sectional view of an example of the ferromagnetic domain/nonmagnetic domain/ferromagnetic domain multi-junction structure.

A multijunction GMR device or TMR device and its multiple circuits can easily be formed on the substrate by combining the detailed patterning of the insulating layer 12 of the first embodiment or the second embodiment and the MR ratio can be further improved. FIG. 4A is a cross sectional view showing the multi-joint structure of the FET structure of the first embodiment. FIG. 4B is a cross sectional view of the ferromagnetic domain/nonmagnetic domain/ferromagnetic domain multi-junction structure. In FIG. 4B, the reference numerals 111 and 113 should be assigned to the ferromagnetic domains between two nonmagnetic domains 112; however, to avoid complexity, one number was assigned.

When comparing the magnetoresistance of the magnetoresistance device comprising the above described multijunction GMR device or TMR device with the simple device shown in FIG. 3, the multijunction quantity is set as n, and the total series-connected magnetoresistance is found to be improved n times.

(Applications of the First, Second and Third Embodiments)

The three-terminal FET structure shown in FIG. 1, 2 and FIG. 4 can easily be incorporated into a magnetic read-out head and magnetic sensor. The present field effect magnetoresistance device operates by sensing the magnetoresistance across the source and drain electrodes of the FET structure, the same as with a typical magnetic head and magnetic sensor. The most significant feature of the device of the present invention is that the MR ratio and the write sensitivity are optimized by setting an optimal gate voltage Vg value. Also clearly apparent is that the power consumption accompanying the field effect does not occur as the leak current from the gate electrode can be ignored. Also, even if an electrical field leakage occurs from the FET structure, the present device has the benefit that the electrical field leakage itself will not alter the magnetism of the section used for magnetic sensing.

Fourth Embodiment

The basic structure and the operating principle of the field effect spin-controlled device of the fourth embodiment is described next while referring to FIG. 5.

Figure 5:
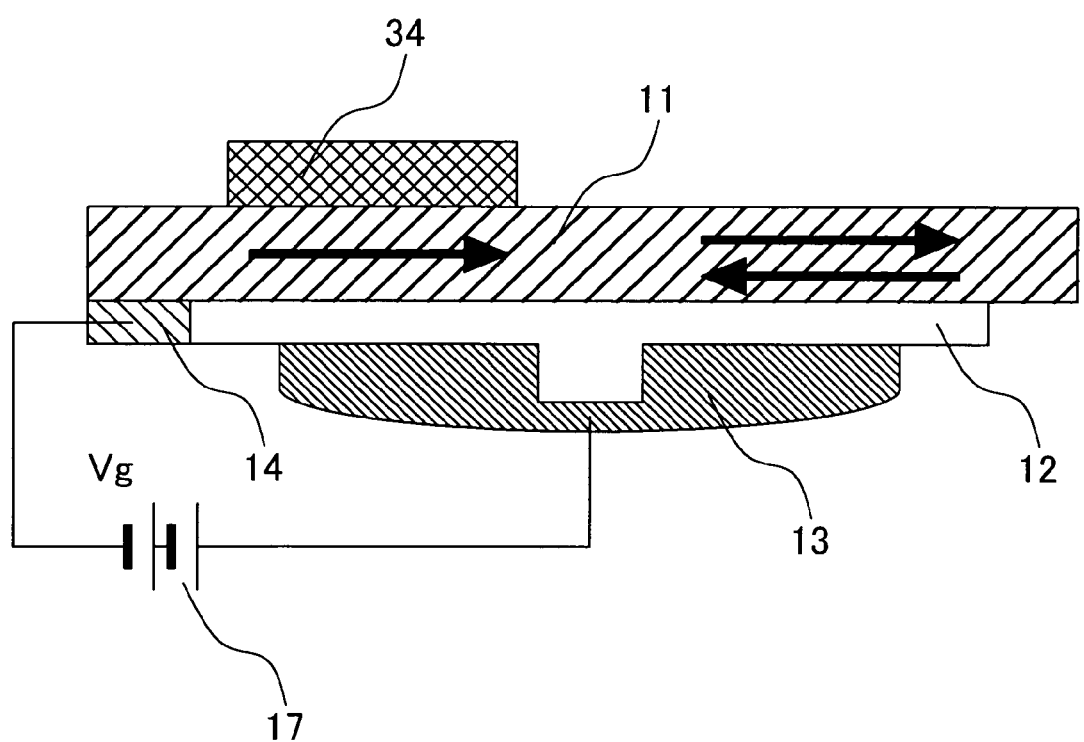
FIG. 5 is a cross sectional view of the field effect spin-controlled device of the fourth embodiment.

FIG. 5 is a cross sectional view of the field effect spin-controlled device of the fourth embodiment. Here, the structure of the substrate 11, insulating layer 12, gate electrode 13 and the gate electrode 14 for applying a gate voltage Vg is the same structure as the field effect magnetoresistance device of the first embodiment. In the fourth embodiment, the antiferromagnetic layer 34 is formed on the surface opposite the surface formed by the gate electrode 13 of substrate 11 at a position matching the left half of the gate electrode 13. The presence of the antiferromagnetic layer 34 fixes (pins) the magnetic orientation (spin) of the first ferromagnetic domain (left side of substrate 11 in drawing) induced when the gate voltage Vg is applied to the gate electrode 13. The first ferromagnetic domain therefore becomes a fixed magnetized layer. This fixed magnetized layer is indicated in FIG. 5 by the thick black arrow on the left side of the substrate 11. However, the magnetism (spin) of the second ferromagnetic domain (right side of substrate 11 in drawing) is not fixed, and the second ferromagnetic domain layer becomes a freely magnetized layer. This freely magnetized layer is indicated in FIG. 5 by the thick arrows with the solid line and or broken lines on the right side of the substrate 11.

Figure 6:
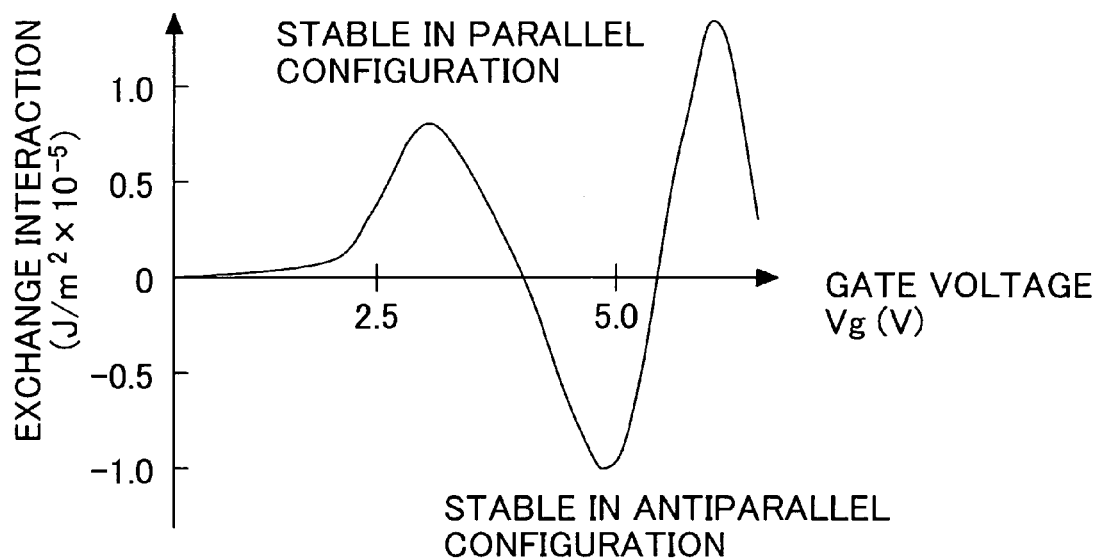
FIG. 6 is a graph showing positive and negative oscillations as a function of the gate voltage Vg in the magnetic exchange interaction between the first ferromagnetic domain and the second ferromagnetic domain.

The effective width of the nonmagnetic domain narrows as the gate voltage Vg increases so the magnetic exchange interaction J between the first ferromagnetic domain and the second ferromagnetic domain as a function of the gate voltage Vg is expressed by the positive and negative swings (oscillation) with a shape such as shown in FIG. 6. In the conventional GMR device comprised of laminations of a ferromagnetic metal layer/nonmagnetic layer/ferromagnetic metal layers, the magnetic exchange interaction J that acts across both ferromagnetic layers is known to have positive/negative swings (oscillations) that are a function of the increasing film thickness of the nonmagnetic layer. This same effect of this phenomenon can be achieved in the field effect spin-controlled device of the fourth embodiment by controlling the gate voltage Vg. This phenomenon is physically explained by the interaction effect of the RKKY mechanism or the quantum well mechanism.

From the above description, with a gate voltage Vg value (3 volts in the example in FIG. 6) for the magnetic exchange interaction J>0, the freely magnetized layer has a spin position parallel to the magnetic direction of the fixed magnetic layer (solid line arrow in FIG. 5). On the other hand, with a gate voltage Vg for the magnetic exchange interaction J<0, (5 volts in the example in FIG. 6) the freely magnetized layer has a spin position that is antiparallel to the magnetization (arrow with broken line in FIG. 5) of the fixed magnetized layer. Therefore the magnetization of the second ferromagnetic domain can be set as needed by controlling the gate voltage Vg.

This magnetic reversal phenomenon of the fourth embodiment can be easily confirmed by an observation means such as spin SEM (spin-polarized scanning electron microscopy) and MFM (magnetic force microscopy).

An overview of the process for fabricating the field effect spin-controlled device of the fourth embodiment is described next. The spin-controlled device is fabricated by a process identical to that in the first embodiment in semiconductor processing technology used for manufacturing MOSFET devices.

A support substrate for forming the three-terminal FET structure is first of all prepared. This support substrate is for example a silicon substrate of a specified thickness. The substrate 11 uses a magnetic semiconductor piece $Mn_xGe_{1-x}$ (X=0.04) capable of being doped with electric field carriers. In the fourth embodiment, both surfaces of the substrate 11 must be processed. To perform this processing, a gate electrode (Au) 13 is first of all formed on this support substrate. A concave structure (recessed section width is 20 nanometers) is formed by stripping away three nanometers in the center structure. An insulating alumina layer ($Al_2O_3$) is then deposited by sputtering or molecular beam epitaxy (MBE) to a uniform film thickness of 5 nanometers on the upper surface of the substrate 11 to form an electrical insulating film 12. The alumina layer here is formed by first depositing aluminum atoms and then using the natural oxidation method or plasma oxidization method. An electrode (gold) 14 is then formed on one side of the insulating film 12. Then, after forming the substrate 11, an antiferromagnetic layer 34 for example of MnIr alloy is formed on the upper surface of the substrate 11 at a position corresponding to the left half of the gate electrode 13. An insulating layer is then formed as a protective layer, and the required wiring formed and connections made to each electrode The substrate 11 the same as in the first embodiment, may be comprised not only by $Mn_xGe_{1-x}$, but by any materials capable of switching the magnetic—nonmagnetic states by typical carrier doping.

Fifth Embodiment

The basic structure and operating principle of the electrically-driven MRAM using the field effect spin-controlled device as described for the fourth embodiment is described next while referring to FIG. 7. Sections in FIG. 7 identical to FIG. 5 are assigned the same reference numerals. After forming the structure shown in FIG. 5, a nonvolatile memory unit 500 is formed on the side opposite the side of substrate 11 where the gate electrode 13 is formed. The nonvolatile memory unit 500 position corresponds to the position of the right half of the gate electrode 13 matching the region formed by the freely magnetized layer of substrate 11. This nonvolatile memory unit 500 is a CPP-GMR memory cell utilizing laminated films comprised from the substrate 11 side, of a nonmagnetic layer 51, a ferromagnetic metal layer 52 (freely magnetized layer)/nonmagnetic metal layer 53/ferromagnetic metal layer 54 (fixed magnetized layer). This nonvolatile memory unit 500 may also be a TMR memory cell utilizing laminated films comprised of a nonmagnetic layer 51, a ferromagnetic metal layer 52 (freely magnetized layer)/nonmagnetic metal layer 53/ferromagnetic metal layer 54 (fixed magnetized layer). The ferromagnetic metal layer 54 has a sufficient thickness versus the ferromagnetic metal layer 52 and so the ferromagnetic metal layer 54 functions as a fixed magnetized layer. The external electrodes 15 and 55 are formed to detect the storage information of the nonvolatile memory unit 500. Even when the gate voltage is off (Vg=0), the nonvolatile memory unit 500 retains the magnetic recording information formed on the freely magnetized layer of the substrate 11.

The write operation (program mode) on the field effect MRAM cell of the fifth embodiment, applies a gate voltage Vg corresponding to the magnetic exchange interaction J>0 to the gate electrode 13, or applies a gate voltage Vg to the gate electrode 13 corresponding to the magnetic exchange interaction J<0 as the data for storage. The magnetization direction (position where nonvolatile memory unit 500 is installed) of the second ferromagnetic region of the substrate 11 is consequently parallel or antiparallel to the magnetization direction at the position where the antiferromagnetic layer 34 is formed within the substrate 11. The magnetization direction of the second ferromagnetic region of the substrate 11 is transferred by way of the magnetic coupling force of the nonmagnetic layer 51 to the ferromagnetic metal layer 52 which is a freely magnetized layer of the nonvolatile memory unit 500. Writing on the GMR or the TMR memory cell is performed in this way.

In the read-out operation (read mode), the gate voltage Vg applied to the gate electrode 13 is off. The substrate 11 is therefore in a nonmagnetic state at this time; however the magnetic recording information (magnetized direction) formed on the substrate by the gate voltage Vg, is still retained in the nonvolatile memory unit 500. Here, sensing current flowing across the electrode 15 and electrode 55, allows performing read-out by detecting the 0 and 1 record (write) bits from changes in the resistance across the electrodes 15-55 the same as in a typical MRAM device.

An overview of the process for fabricating the electrically driven MRAM cell of the fifth embodiment is described next. Here also, the electrically driven MRAM cell is fabricated by a process identical to that in the first embodiment for manufacturing MOS-FET devices.

The structure shown in FIG. 5 is fabricated using the process for manufacturing the field effect spin-controlled device of the fourth embodiment. In this case, the external electrode 15 is formed along with the forming of the electrode 14. Next, the nonmagnetic layer 51 (Cu: copper) is formed to a thickness of two nanometers at a position on the substrate 11 where there is no antiferromagnetic layer 34. A laminated structure made up of the freely magnetized layer 52 (CoFe: 661 alloy of cobalt and iron) in a thickness of five nanometers, a nonmagnetic metal layer 53 ($Al_2O_3$) in a thickness of two nanometers, a fixed magnetic layer 54 (CoFe) in a thickness of 10 nanometers and further an electrode 55 (gold) are formed as the TMR device memory cell of the related art. An insulating layer is then formed as a protective layer, and the required wiring formed and connections made to each electrode.

Writing is performed by setting the gate voltage to on and changing the Vg from 3 volts to a Vg of 5 volts and inverting the magnetic direction of the freely magnetized layer 506 that is the magnetic recording (write) unit. Read is performed by setting the gate voltage to off (Vg=0 volts) and fixing the magnetic direction of the write bit 0 (equivalent to a low resistance value) and 1 bit (equivalent to high resistance value) by detecting the resistance value across the electrode 505 through 509. The resistance value can also be detected by utilizing a CMOS transistor to select the memory cell position the same as with the MRAM of the related art.

The size of the TMR device memory cell can be made to approximately 100 by 100 nanometers, attaining a highly integrated memory device. A GMR memory cell of the related art may be utilized instead of this TMR memory cell.

Figure 7:
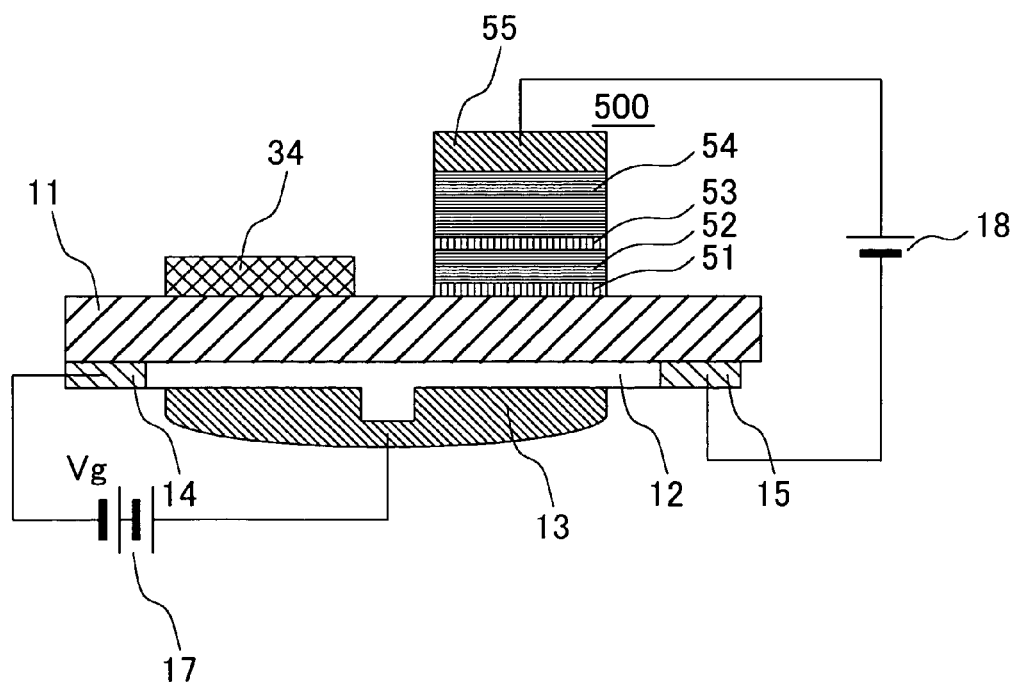
FIG. 7 is a drawing showing the operating principle and the basic structure of the electrically-driven MRAM utilizing the field effect spin-controlled device described in the fourth embodiment.
Figure 8:
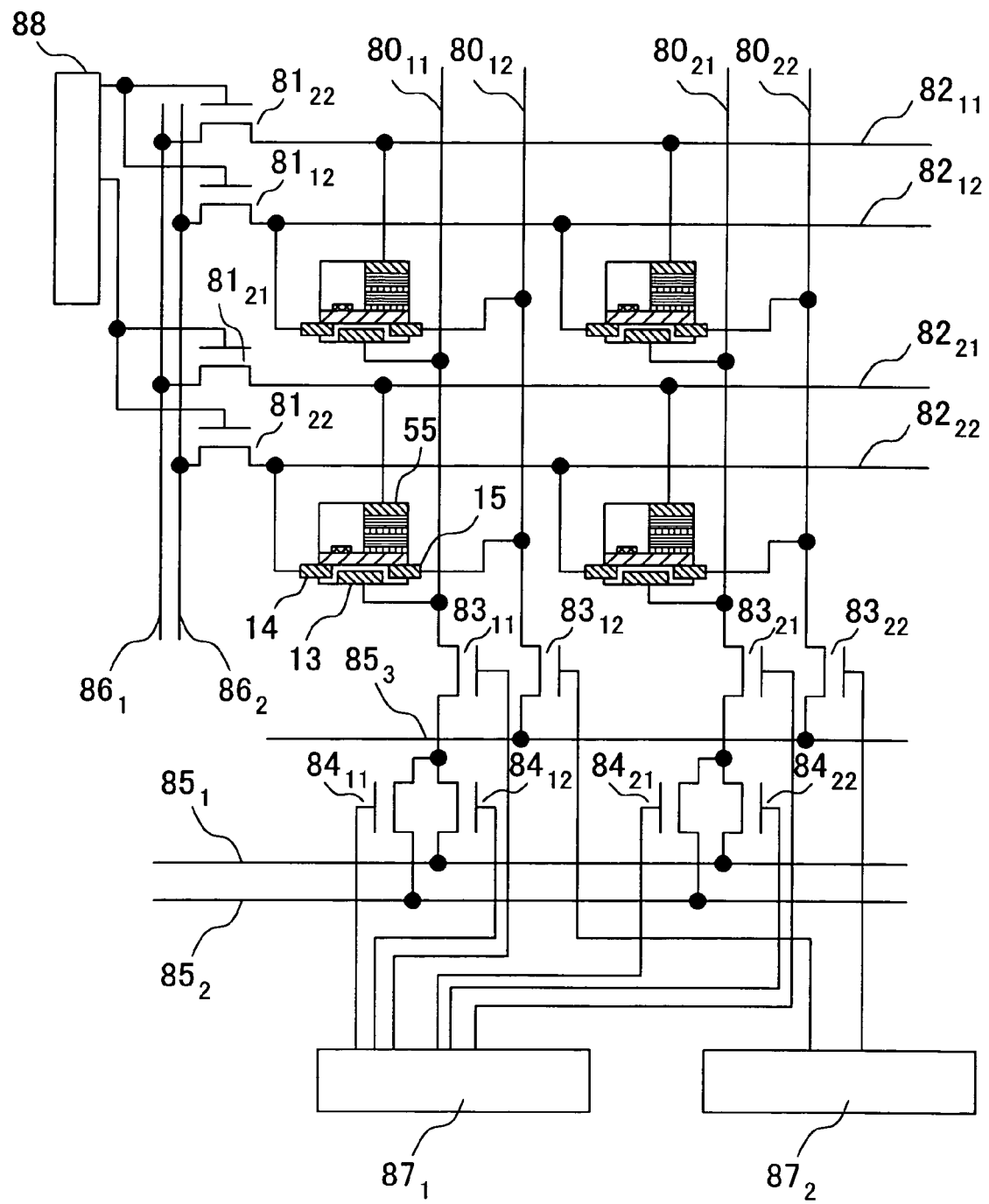
FIG. 8 is a diagram showing the circuit configuration of the fixed memory when the electrically-driven MRAM cells shown in FIG. 7 are arrayed in a 2-row vertical and 2-row horizontal X-Y matrix.

FIG. 8 is a diagram showing the circuit configuration of the fixed memory when the electrically-driven MRAM cells shown in FIG. 7 are arrayed in a 2-row vertical and 2-row horizontal X-Y matrix. To write data on the electrically-driven MRAM cells, two types of voltages must be selected according to the data and then applied across the gate electrode 13 and electrode 14. To read data, a voltage applied across the electrode 15 and the electrode 55 must be applied and the current flow then detected. Since the write power supply and the read power supply should be separate, two word lines $82_{11}$, $82_{12}$ and $82_{21}$, $82_{22}$ are provided for each cell as clearly shown by referring to FIG. 7. These word line pairs are selected are each simultaneously selected by the word decoder 88. The word decoder 88 is connected by the switches $81_{11}$, $81_{12}$ and $81_{21}$, $81_{22}$ to the separate wires $86_1$, $86_2$. Two bit lines are connected to each electrically-driven MRAM cell. In other words, the MRAM cells are connected to the bit lines $80_{11}$, $80_{12}$ and $80_{21}$, $80_{22}$. Besides the switches $83_{11}$ and $83_{21}$ connecting to the bit lines $80_{11}$ and $80_{21}$, bit lines also respectively connect to the parallel circuit formed by the switches $84_{11}$ and $84_{12}$ as well as the parallel circuit formed by the switches $84_{12}$ and $84_{22}$. The power supply lines $85_1$, $85_2$ respectively connect to other end of the switches $84_{11}$ and $84_{21}$, and the other end of the switches $84_{12}$ and $84_{22}$. The voltages of the power supply lines $85_1$, $85_2$, are 3 volts, 5 volts on the line $86_2$ according to the characteristics of FIG. 6. Along with the switches $83_{12}$ and $83_{22}$ connected to the bit lines $80_{12}$, $80_{22}$, the data line $85_3$ connects to the other end of the switches $83_{12}$ and $83_{22}$. This data line $85_3$ is set to a readout voltage by the line $86_1$.

The bit lines are respectively selected by the write bit decoder $87_1$ and the read-out bit decoder $87_2$. However when the switches $83_{11}$ and $83_{21}$ are turned on by the write bit decoder $87_1$, either the switches $84_{11}$ and $84_{12}$, and either or the switches $84_{12}$ and $84_{21}$ simultaneously turns on according to the write data.

The electrically-driven MRAM cell is positioned at the cross point of the word line and bit line as shown in FIG. 7. To avoid complexity, reference numerals are only assigned to the electrodes 13, 14, 15 and 55 for one cell, and the others are omitted. The electrodes 14 and 15 are shown in a shape protruding from the other layers to make the wiring easy to view. The electrode 55 of the electrically-driven MRAM cell is connected to the first word lines $82_{11}$ and $82_{12}$. The gate electrode 14 of the electrically-driven MRAM cell is connected to second word lines $82_{12}$ and $82_{22}$. The gate electrode 13 of the electrically-driven MRAM cell is connected to the first bit lines $80_{11}$ and $80_{21}$. The gate electrode 15 of the electrically-driven MRAM cell is connected to the second bit lines $80_{12}$ and $80_{22}$.

Read and write can in this way be performed on the cell selected by the decoder.

Figure 9:
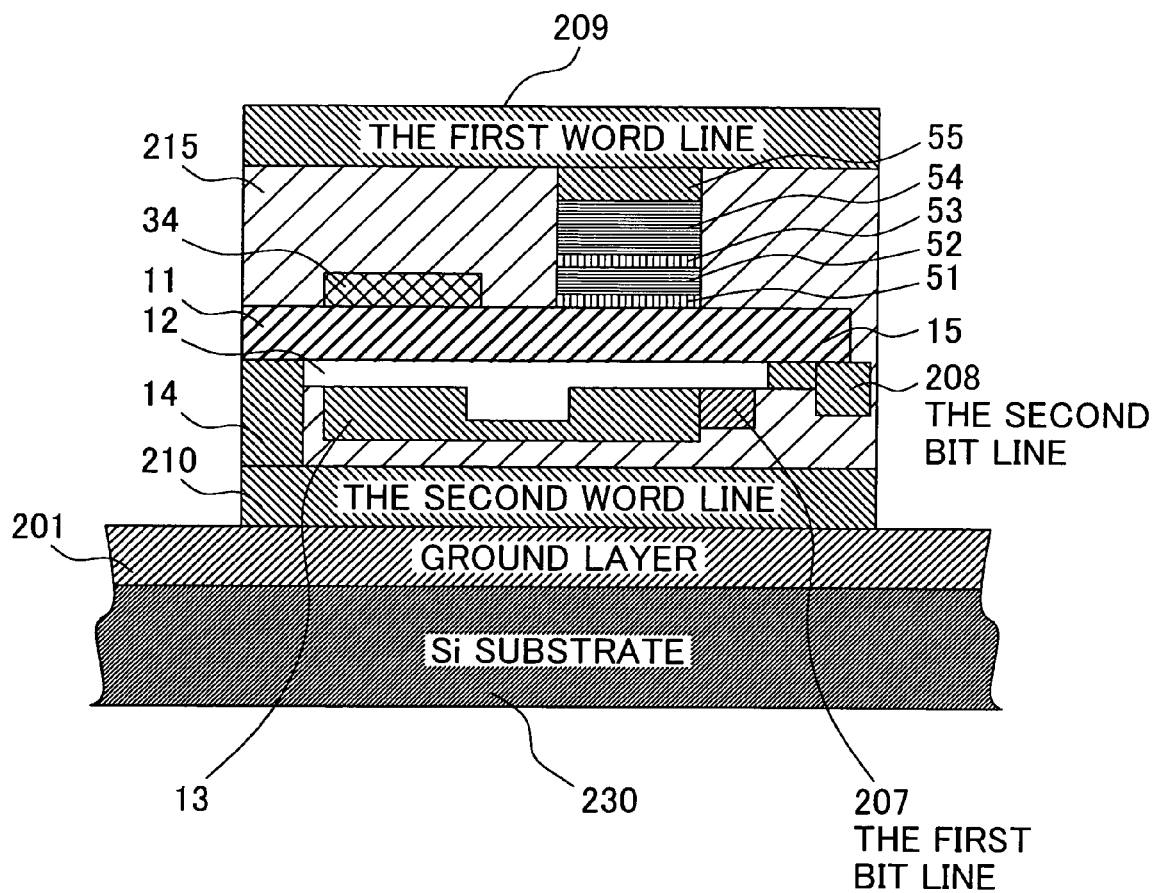
FIG. 9 is a concept drawing showing an example of one memory device mounted on the silicon substrate of the fixed memory when the electrically-driven MRAM cells shown in FIG. 8 are arrayed in a 2-row vertical and 2-row horizontal X-Y matrix.

FIG. 9 is a drawing showing an example of one solid-state memory device mounted on the silicon substrate wherein the electrically-driven MRAM cells shown in FIG. 8 are arrayed in a 2-row vertical and 2-row horizontal X-Y matrix.

A bottom layer is formed uniformly over the surface of the silicon substrate 230. Patterning in a direction parallel to the paper surface is then performed for the second word line 210 (word line shown in FIG. 8 by reference numerals $82_{12}$ and $82_{22}$) according to the specified density of the memory device array. The electrically-driven MRAM cells shown in FIG. 8 are next sequentially laminated and a detailed description is omitted. In this process, the first bit line 207 connecting to the gate electrode 13 (bit line shown by reference numeral $80_{11}$ in FIG. 8) is patterned in a direction perpendicular to the paper surface. Next, besides connecting the source electrode 14 to the second word line 210, the second bit line 208 connecting to the drain electrode 15 (bit line shown by the reference numeral $80_{12}$ in FIG. 8) is patterned in a direction perpendicular to the paper surface. The first word line 209 connecting to the electrode 55 is patterned in a direction perpendicular to the paper surface (word line shown in FIG. 8 by reference numerals $82_{11}$ and $82_{21}$). Each line and each element are covered by an insulating film 215 between layers.

The MRAM of the related art has the unavoidable problem of large power consumption as the memory cells become more miniaturized, caused by the electrical current flowing along the wiring layer to write on the miniaturized memory cells. However, the electrically-driven MRAM cell of the present invention performs writing by selecting a gate voltage Vg so an electrically-driven MRAM cell with low power consumption can be fabricated. There is also no increase in power consumption as the cells become more miniaturized so the present invention is also ideal for large capacity MRAM.

Other Embodiments

Figure 10:
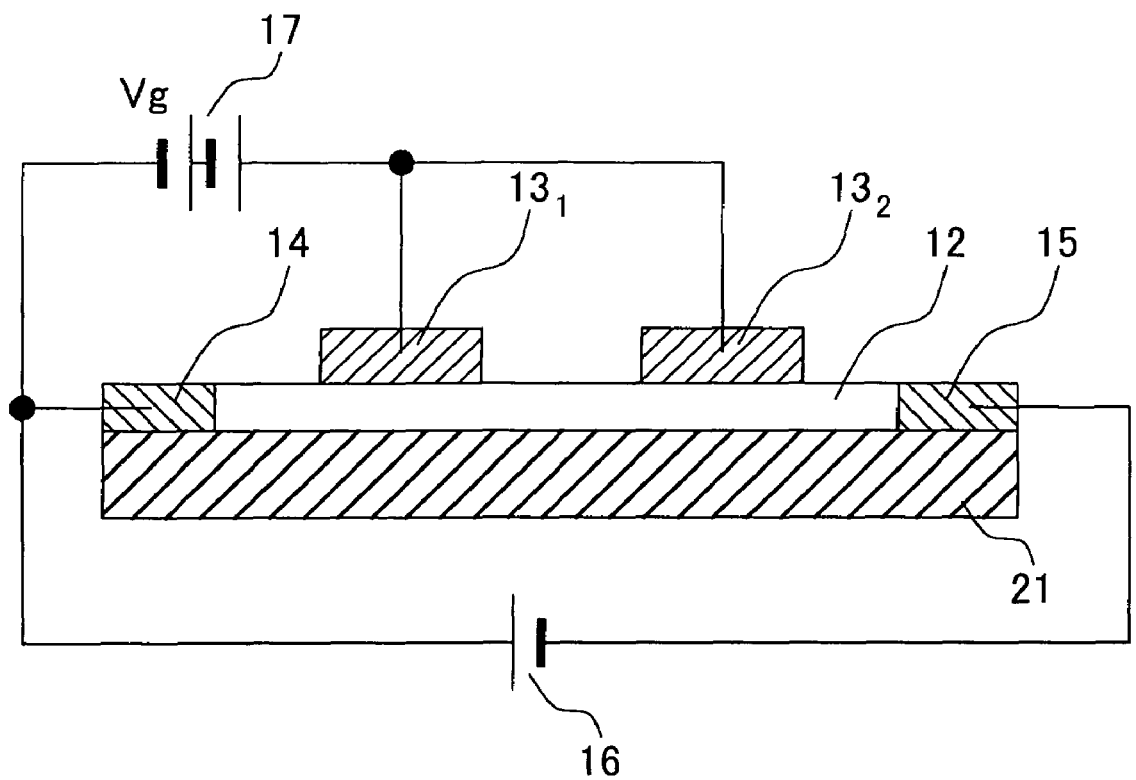
FIG. 10 is a cross sectional view showing another FET structure of the gate electrode 13 in the field effect magnetoresistance device of the first embodiment shown in FIG. 1A.

FIG. 10 is across sectional view showing another FET structure of the gate electrode 13 in the field effect magnetoresistance device of the first embodiment shown in FIG. 1A. An electrical insulating layer 12 whose structure is patterned in a convex shape is formed on the upper part of the nonmagnetic substrate 11 capable of being doped with electric field carriers. A first metallic electrode (gate electrode) 13 is formed on the insulating (film) layer 12. The other embodiments are the same as the first embodiment with the exception that the gate electrode 13 is divided into $13_1$ and $13_2$. An external section applies a positive voltage of Vg>0 to the gate electrode 13 from the power supply 17. A strong electrical field is applied locally to the substrate directly below the region below the gate electrodes $13_1$ and $13_2$. This region can be doped with a high concentration of hole carriers (forms a doped region with high carrier concentration). On the other hand, the substrate directly below the substrate 11 in sections where there are no gate electrodes $13_1$ and $13_2$ is indirectly affected only by a weak electrical field and that portion of the substrate can be doped with a low concentration of hole carriers (forms a doped region with a low carrier concentration).

The nonmagnetic substrate 11 shown for the field effect magnetoresistance device of the first embodiment can therefore be formed with the junction structure of the ferromagnetic domain/nonmagnetic domain/ferromagnetic domain patterned in a flat shape shown in FIG. 1B. This magnetoresistance device possesses substantially the same characteristics of the field effect magnetoresistance device of the first embodiment.

The field effect magnetoresistance device of the present invention outputs a sufficiently strong output signal with an MR ratio larger than the TMR device of the related art and so can therefore be used with different types of magnetic sensors and read/write heads of high density magnetic recording media. A field effect spin-controlled device is also provided that performs magnetic reversal with low electrical power consumption. By utilizing this electrically-driven magnetic reversal technology, the present invention can provide an electrically-driven MRAM with a large storage capacity and low power consumption.

The invention claimed is:

1. A field effect spin-controlled device comprising:
a substrate capable of being doped by an electrical field;
an insulating layer formed on one surface of said substrate; and
a gate electrode formed on another surface of said insulating layer and an antiferromagnetic layer formed on a portion of said another surface of said substrate,
wherein along with forming a first ferromagnetic domain, a nonmagnetic domain, and a second ferromagnetic domain when a non-uniform electrical field is applied to the substrate formed so that the gap between said substrate and said gate electrode differs according to the substrate position; the magnetic exchange interaction acting by way of the nonmagnetic domain across the first and the second ferromagnetic domains is controlled by the size of the electrical field.

2. A memory comprising:
a substrate capable of being doped by an electrical field;
an insulating layer formed on one surface of said substrate;
a gate electrode formed on another surface of the insulating layer;
an antiferromagnetic layer formed on a section of said another surface of said substrate; and
nonvolatile storage units formed on another section of said another surface of said substrate,
wherein along with forming a first ferromagnetic domain, a nonmagnetic domain, and a second ferromagnetic domain when a non-uniform electrical field is applied to the substrate formed so that the gap between said substrate and said gate electrode differs according to the substrate position; the magnetic exchange interaction acting by way of the nonmagnetic domain across the first and the second ferromagnetic domains is controlled by the size of the electrical field, and the result from controlling the electrical field is stored in the nonvolatile storage unit as the magnetic direction of the ferromagnetic domain.

3. A memory according to claim 2, wherein the nonvolatile storage unit is a memory cell utilizing laminated films comprised from the substrate side of a nonmagnetic layer, a ferromagnetic metal layer (freely magnetized layer)/nonmagnetic metal layer/ferromagnetic metal layer (fixed magnetized layer); or is a memory cell utilizing laminated films comprised of a nonmagnetic layer, a ferromagnetic metal layer (freely magnetized layer)/nonmagnetic insulating layer, and a ferromagnetic metal layer (fixed magnetized layer).

4. A memory according to claim 2, wherein the substrate is a magnetic semiconductor with a portion of the atoms of type IV or type III-V semiconductors substituted with magnetic atoms, or is a magnetic semiconductor with a portion of the atoms of the wide-gap semiconductor substituted with magnetic atoms, or is a perovskite crystal structures made up of manganese oxides or is a granular structure of GaAs/MnSb.

5. A memory according to claim 2, wherein
the nonvolatile storage unit has a first ferromagnetic layer, a second ferromagnetic layer, a first nonmagnetic layer formed between the substrate and the first ferromagnetic layer, and a second nonmagnetic layer formed between the first ferromagnetic layer and the second ferromagnetic layer,
during a writing operation, a magnetization direction of the second ferromagnetic domain of the substrate is transferred to the first ferromagnetic layer of the nonvolatile storage unit.

6. A memory according to claim 5, wherein the magnetization direction of the second ferromagnetic domain of the substrate is transferred by way of a magnetic coupling force.

7. A memory according to claim 6, wherein the first ferromagnetic layer of the nonvolatile storage unit is a freely magnetized layer.

* * * * *